United States Patent
Arberet et al.

(10) Patent No.: US 11,062,488 B2
(45) Date of Patent: Jul. 13, 2021

(54) MAGNETIC RESONANCE FINGERPRINTING BASED ON BLOCH MANIFOLD AND SPATIAL REGULARIZATIONS IN PARALLEL

(71) Applicant: Siemens Healthcare GmbH, Erlangen (DE)

(72) Inventors: Simon Arberet, Princeton, NJ (US); Boris Mailhe, Plainsboro, NJ (US); Xiao Chen, Princeton, NJ (US); Mariappan S. Nadar, Plainsboro, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 362 days.

(21) Appl. No.: 16/199,392

(22) Filed: Nov. 26, 2018

(65) Prior Publication Data
US 2020/0005497 A1 Jan. 2, 2020

Related U.S. Application Data (60) Provisional application No. 62/691,205, filed on Jun. 28, 2018.

(51) Int. Cl.
| | |
|---|---|
| G06K 9/00 | (2006.01) |
| G06T 11/00 | (2006.01) |
| G01R 33/56 | (2006.01) |
| G01R 33/48 | (2006.01) |
| G06K 9/62 | (2006.01) |
| G06T 15/08 | (2011.01) |

(52) U.S. Cl.
CPC ........ *G06T 11/006* (2013.01); *G01R 33/4828* (2013.01); *G01R 33/5608* (2013.01); *G06K 9/6201* (2013.01); *G06T 11/008* (2013.01); *G06T 15/08* (2013.01); *G06T 2210/41* (2013.01); *G06T 2211/424* (2013.01)

(58) Field of Classification Search
None
See application file for complete search history.

(56) References Cited

U.S. PATENT DOCUMENTS

2015/0302579 A1* 10/2015 Griswold ........... G01R 33/5608
                                                                        382/128
2017/0115368 A1* 4/2017 Chen .................. G01R 33/4824

OTHER PUBLICATIONS

Ramani, Sathish, and Jeffrey A. Fessler. "Parallel MR image reconstruction using augmented Lagrangian methods." IEEE Transactions on Medical Imaging 30.3 (2010): 694-706. (Year: 2010).*
Cline, Christopher C., et al. "AIR-MRF: Accelerated iterative reconstruction for magnetic resonance fingerprinting." Magnetic resonance imaging 41 (2017): 29-40. (Year: 2017).*
Chen, Xiao, et al. "Iterative Magnetic Resonance Fingerprinting Reconstruction." U.S. Appl. No. 15/332,336.
(Continued)

*Primary Examiner* — Sean M Conner (57) ABSTRACT

Systems and methods are provided for iterative reconstruction of a magnetic resonance image using magnetic resonance fingerprinting. An image series is estimated according to the following four steps: a gradient step to improve data consistency, fingerprint matching, spatial regularization, and a merging step. The fingerprint matching and spatial regularization steps are performed in parallel.

19 Claims, 6 Drawing Sheets

(56) References Cited

OTHER PUBLICATIONS

Davies, Mike, et al. "A compressed sensing framework for magnetic resonance fingerprinting." SIAM Journal on Imaging Sciences 7.4 (2014): 2623-2656.
Doneva, Mariya, et al. "Matrix completion-based reconstruction for undersampled magnetic resonancefingerprinting data." Magnetic Resonance Imaging (2017).
Mazor, Gal, et al. "Low rank magnetic resonance fingerprinting." Engineering in Medicine and BiologySociety (EMBC), 2016 IEEE 38th Annual International Conference of the. IEEE, 2016.
Pierre E. et al. "Fast Analytical Solution for Extreme Unaliasing of MR Fingerprinting Image Series" ISMRM 2017.
Wang, Zhe, et al. "Magnetic resonance fingerprinting with compressed sensing and distance metriclearning." Neurocomputing 174 (2016): 560-570.
Zhao, Bo, et al. "Improved magnetic resonance fingerprinting reconstruction with low-rank and subspace modeling." Magnetic resonance in medicine 79.2 (2018): 933-942.

* cited by examiner

MAGNETIC RESONANCE FINGERPRINTING BASED ON BLOCH MANIFOLD AND SPATIAL REGULARIZATIONS IN PARALLEL

CROSS REFERENCE TO RELATED APPLICATIONS

This application claims the benefit of U.S. Provisional Application No. 62/691,205, filed Jun. 28, 2018, which is hereby incorporated by reference in its entirety.

FIELD

The present embodiments relate to medical image processing.

BACKGROUND

Magnetic resonance fingerprinting is a technique for multi-parametric quantitative imaging. The technique aims to obtain multiple parameters, such as spin-lattice relaxation time (T1) (also known as the longitudinal relaxation time), spin-spin transverse relaxation time (T2) (also known as the transverse relaxation time), proton density (PD), etc., for an object by applying a series of excitations to the object, acquiring a signal response of the object to the series of excitations, and matching the undersampled signal response to a simulated response found in a dictionary or database of possible simulated responses.

Each simulated response stored in the dictionary is generated by running Bloch equations with relevant values for magnetic resonance parameters (T1, T2, PD, etc.). Once a match is found between the undersampled signal response and a simulated response in the dictionary, the magnetic resonance parameters (T1, T2, PD, etc.) corresponding to the matched simulated response may be retrieved from the dictionary and used for further imaging purposes. For a single iteration, the amount of data in an MR signal is not enough to provide a match to the dictionary entry with sufficient accuracy. Iterative processes are therefore employed to help refine the dictionary matching process. However, iterative processes require the repetition of various computationally expensive steps, such as dictionary search steps and signal comparison steps.

SUMMARY

By way of introduction, the preferred embodiments described below include methods and systems for an iterative process for Magnetic Resonance Fingerprinting. The process incorporates spatial and low rank regularization in the reconstruction. Low rank is imposed by compressing the fingerprint dictionary beyond the rank of the dictionary. Fingerprint matching and regularization are performed in parallel and the outputs merged to provide an input for the next iteration.

In a first aspect, a method is provided for generating a reconstructed image of an object. One or more compressed images are acquired from one or more magnetic resonance k-space signals obtained from the object. An image is iteratively reconstructed. Each iteration includes: updating a gradient, applying fingerprint matching to the one or more compressed images to generate one or more first updated compressed images, applying spatial regularization to the one or more compressed images to generate one or more second updated compressed images, and merging the one or more first updated compressed images and the one or more second updated compressed images. The one or more merged compressed images are used as input for a subsequent iteration.

After a final iteration, and additional fingerprint matching step may be performed to the merged compressed image to generate the image. Iteratively reconstructing may include at least three iterations.

In an embodiment, applying fingerprint matching and applying spatial regularization may be performed concurrently.

In an embodiment, applying fingerprint matching includes compressing a dictionary to a value of a rank of the dictionary and searching the compressed dictionary for a representative magnetic resonance fingerprint. The value of the value of the rank may be between 5 and 20, for example, 10. The value of the rank may be the value of a contrast images data volume reshaped in a matrix form of size comprising a number of pixels multiplied by a number of time points.

In an embodiment, applying spatial regularization may include applying spatial regularization using one of: Chambolle dual algorithm for total variation regularization, L1 thresholding in the wavelet domain, Chambolle-Pock algorithm for L1 minimization on a redundant sparse representation, joint sparse regularization, or a cycle spinning technique.

In a second aspect, a method is provided for generating a magnetic resonance image of an object. MR image data is acquired from one or more magnetic resonance k-space signals obtained from the object. A dictionary is compressed to a value. Data fidelity is performed on the MR image data. The compressed dictionary is searched for a representative magnetic resonance fingerprint. A first compressed image is generated using the representative magnetic resonance fingerprint. Spatial regularization is applied to the compressed image to generate a second compressed image. The first compressed image and the second compressed image are merged. Performing, searching, generating, applying, and merging are repeated for at least two iterations or at least three iterations.

After a final iteration, fingerprint matching may be applied to the merged compressed image to generate the magnetic resonance image. The merged compressed image may also be displayed.

The dictionary may be compressed to a rank of the dictionary.

Spatial regularization may be applied using one of Chambolle dual algorithm for total variation regularization, L1 thresholding in the wavelet domain, Chambolle-Pock algorithm for L1 minimization on a redundant sparse representation, joint sparse regularization, or a cycle spinning technique.

In an embodiment, performing the search of the compressed dictionary comprises performing a nearest neighbor search technique.

In a third aspect, a system for generating an image using magnetic resonance fingerprinting is provided. The system includes a magnetic resonance imaging device and a control unit. The magnetic resonance imaging device is configured to acquire MR dat. The control unit includes a memory and an image processor. The memory is configured to store a compressed dictionary of magnetic resonance fingerprints, the compressed dictionary compressed to a value of a rank of a contrast images data volume reshaped in a matrix form of size comprising a number of pixels multiplied by a number of time points. The image processor is configured to iteratively construct the image from the MR data in parallel using the compressed dictionary of magnetic resonance fingerprints and spatial regularization.

The system may include a display configured to display the image.

The image processer is configured to iteratively construct the image by applying data fidelity to the MR data, performing fingerprint matching of the MR data using the compressed dictionary, generating an estimated image using parameters of a matched fingerprint, applying spatial regularization to the MR data, and merging an output of the spatial regularization and the estimated image.

Spatial regularization may be applied using one of Chambolle dual algorithm for total variation regularization, L1 thresholding in the wavelet domain, Chambolle-Pock algorithm for L1 minimization on a redundant sparse representation, joint sparse regularization, or a cycle spinning technique.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION

An iterative process for magnetic resonance fingerprinting (MRF) is provided where an image series is estimated according to the following four steps: a gradient step, a fingerprint matching step, a spatial regularization step, and a merging step. The fingerprint matching and spatial regularization steps are performed in parallel and merged to provide the input to the gradient step for the next iteration.

MRF permits the non-invasive quantification of multiple properties of a material or tissue simultaneously through an approach to data acquisition, post-processing and visualization. MRF provides a mechanism to quantitatively detect and analyze complex changes that may represent physical alterations of a substance or early indicators of disease. MRF may also be used to specifically identify the presence of a target material or tissue. Identifying the material or tissue may increase the sensitivity, specificity, and speed of an MR study, and potentially lead to new diagnostic testing methodologies. When paired with an appropriate pattern recognition algorithm, MRF suppresses measurement errors and thus may improve accuracy compared to other approaches.

One issue with MRF is that it is computationally expensive. Previous MRF techniques may trade off quality for speed or vice versa. A fast, inexpensive technique may lead to improved medical diagnosis and treatment.

Figure 1:
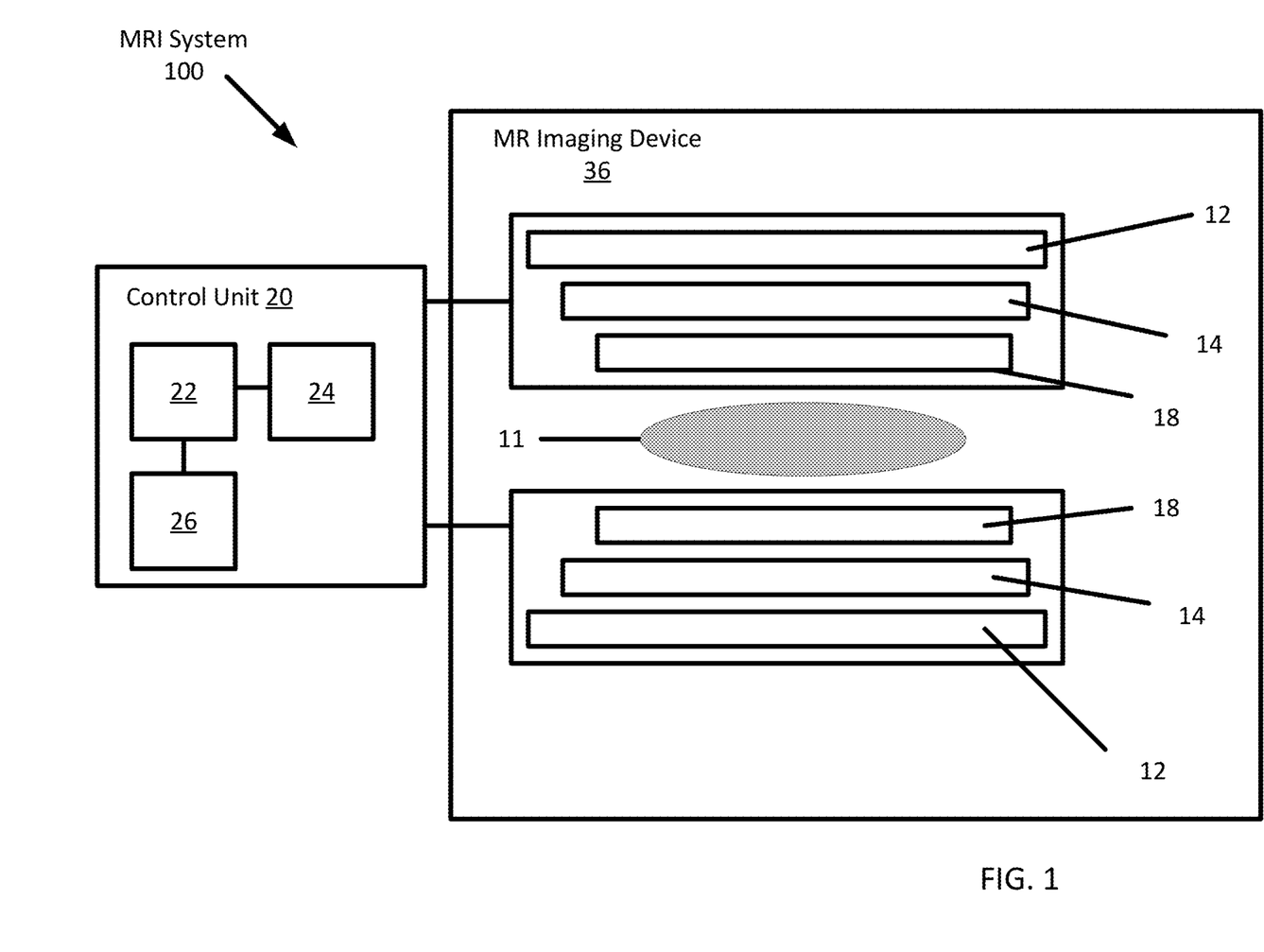
FIG. 1 depicts an example MRI system.

FIG. 1 depicts an MRI system 100 for acquisition of frequency domain components representing Magnetic Resonance (MR) data for storage in a storage array. The MRI system 100 includes a control unit 20 that is configured to process the MR signals and generate images of the body for display to an operator. The control unit 20 may store the MR signals and data for later processing or viewing in a memory 24. The control unit 20 may include a display 26 for presentation of images to an operator. The MR scanning system 100 is only exemplary, and a variety of MR scanning systems may be used to collect the MR data.

In the MRI system 100, magnetic coils 12 create a static base or main magnetic field in the body of patient 11 or an object positioned on a table and imaged. Within the magnet system are gradient coils 14 for producing position dependent magnetic field gradients superimposed on the static magnetic field. Gradient coils 14, in response to gradient signals supplied thereto by a gradient and control unit 20, produce position dependent and shimmed magnetic field gradients in three orthogonal directions and generate magnetic field pulse sequences. The shimmed gradients compensate for inhomogeneity and variability in an MR imaging device magnetic field resulting from patient anatomical variation and other sources.

The control unit 20 may include a RF (radio frequency) module that provides RF pulse signals to RF coil 18, that produces magnetic field pulses that rotate the spins of the protons in the imaged body of the patient 11 by ninety degrees or by one hundred and eighty degrees for so-called "spin echo" imaging, or by angles less than or equal to 90 degrees for "gradient echo" imaging. Gradient and shim coil control modules in conjunction with RF module, as directed by control unit 20, control slice-selection, phase-encoding readout gradient magnetic fields, radio frequency transmission, and magnetic resonance signal detection, to acquire magnetic resonance signals representing planar slices of the patient 11.

In response to applied RF pulse signals, the RF coil 18 receives MR signals, e.g. signals from the excited protons within the body as the protons return to an equilibrium position established by the static and gradient magnetic fields. The MR signals are detected and processed by a detector within RF module and the control unit 20 to provide an MR dataset to an image data processor 22 for processing. In some embodiments, the image data processor 22 is located in the control unit 20, in other embodiments, the image data processor 22 is located remotely. A two or three-dimensional k-space storage array of individual data elements in a memory 24 of the control unit 20 stores corresponding individual frequency components including an MR dataset. The k-space array of individual data elements includes a designated center, and individual data elements individually include a radius to the designated center.

MRF utilizes the fact that each tissue responds differently to a pulse sequence. By varying the acquisition parameters (e.g. repetition time (TR), echo time (TE), and radio frequency flip angle (FA)), unique signals are generated from different tissues. After acquisition, a search function is used to match the acquired signal from each pixel or voxel to an entry from a dictionary of possible tissue candidates. The dictionary entries are created by simulating the tissue's response to the sequence for a range of T1 and T2 parameter values, using Bloch equations. The resulting dictionary contains the temporal signatures of various simulated materials along with the associated pseudo-random pulse sequence. The quantitative parameters, such as the tissue's T1 and T2 relaxation times, may be retrieved from the data by matching the signature acquired to the most correlated entry in the dictionary.

Figure 2:
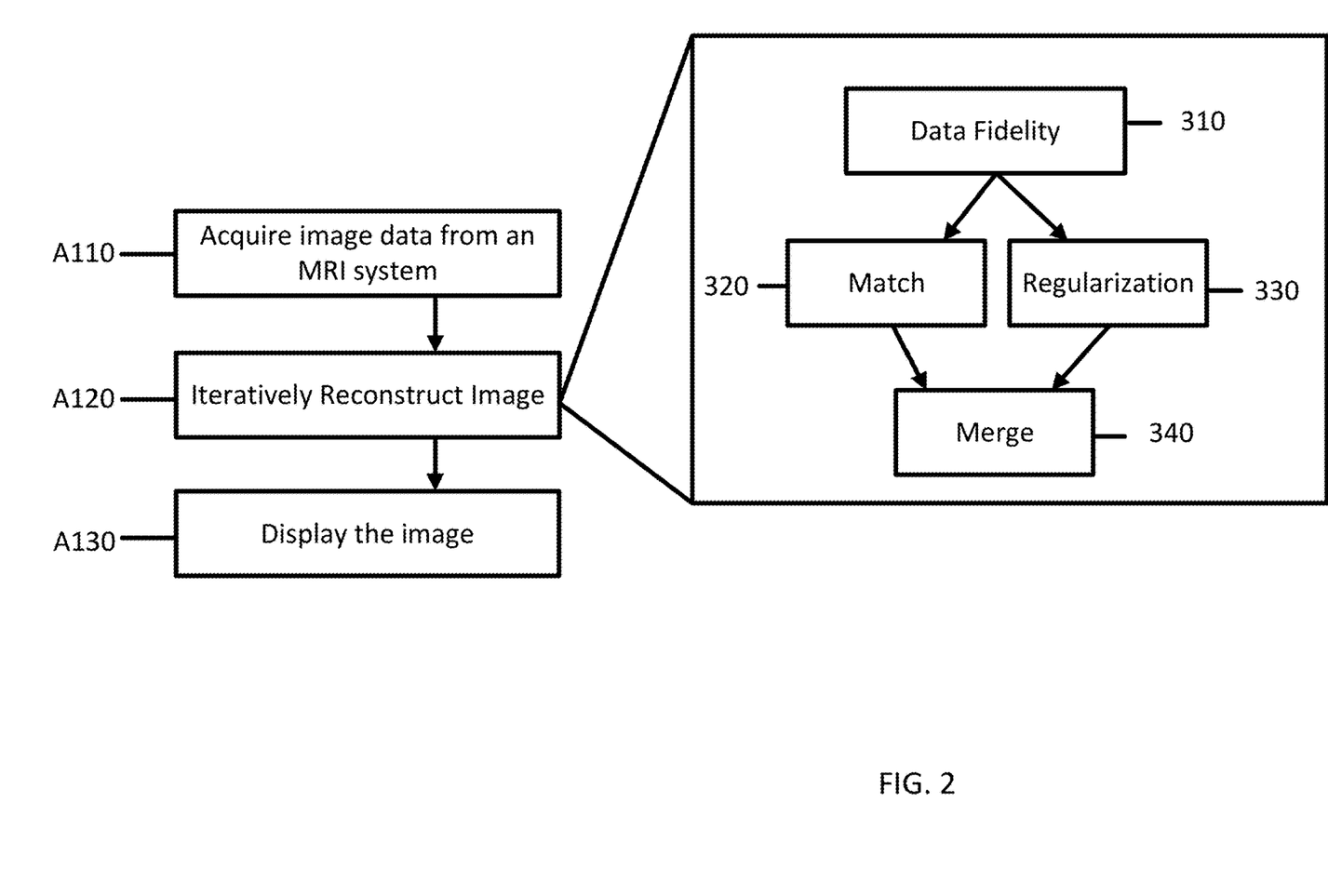
FIG. 2 depicts an example method for generating an image using magnetic resonance fingerprinting.

FIG. 2 depicts an example method for generating an image using MRF. The method provides an efficient iterative reconstruction method using a compression technique that in addition to the finger print matching, incorporates a low-rank spatial regularization. The fingerprint matching and the spatial regularization are performed in parallel. The acts are performed by the system of FIG. 1, FIG. 6, other systems, an MR scanner, a workstation, a computer, and/or a server. Additional, different, or fewer acts may be provided. The acts are performed in the order shown (e.g., top to bottom) or other orders.

At act A110, an object is scanned by a magnetic resonance imaging system to acquire MR data. As depicted and described in FIG. 1 above, the MR data may be acquired using an MR scanner. For example, gradient coils, a whole-body coil, and/or local coils generate a pulse or scan sequence in a magnetic field created by a main magnet or coil. The whole-body coil or local coils receive signals responsive to the re-orientation of molecules shifted due to the scan sequence. In an embodiment and used as an example below, the MR data may represent image data for an organ of a patient, for example a lung or brain. Different objects, organs, or regions of a patient may also be scanned.

The MR data includes k-space data or image data. Image data may be MR data at any point after transform, so may be scalar values or may be formatted as RGB values for a display screen. For example, image data may be MR data after Fourier transform into object space. The MR data may be scan data to be used to generate an image on a display. The MR data may represent volumes. As k-space data, information content may be provided that is responsive to a three-dimensional distribution of locations, but the data itself does not directly represent the locations prior to transform. In alternative embodiments, two-dimensional datasets representing or responsive to tissue in planes are obtained. Three-dimensional or two-dimensional datasets may be obtained. Three-dimensional datasets are made up of voxels. Two-dimensional datasets are made up of pixels. Voxels or pixels may be assigned a value that represents different attributes derived from the MR data or generated from the steps described below. Alternative methods may be used to acquire the MR data. The MR data may be acquired remotely from the server or workstation or may be acquired at a different time, for example, hours or days prior to the processing provided below. The MR data may be stored locally onsite or offsite, for example in the cloud.

At act A120, an iterative reconstruction is applied to the MR data. The iterative reconstruction includes four stages, a data fidelity stage 310, a fingerprint matching stage 320, a spatial regularization stage 330, and a merging stage 340 that merges the outputs of the fingerprint matching stage and spatial regularization stage. The iterative reconstruction is initialized with one or more compressed images. The output of the iterative reconstruction is image data that may represent an image of an object and may be displayed to an operator.

Figure 3:
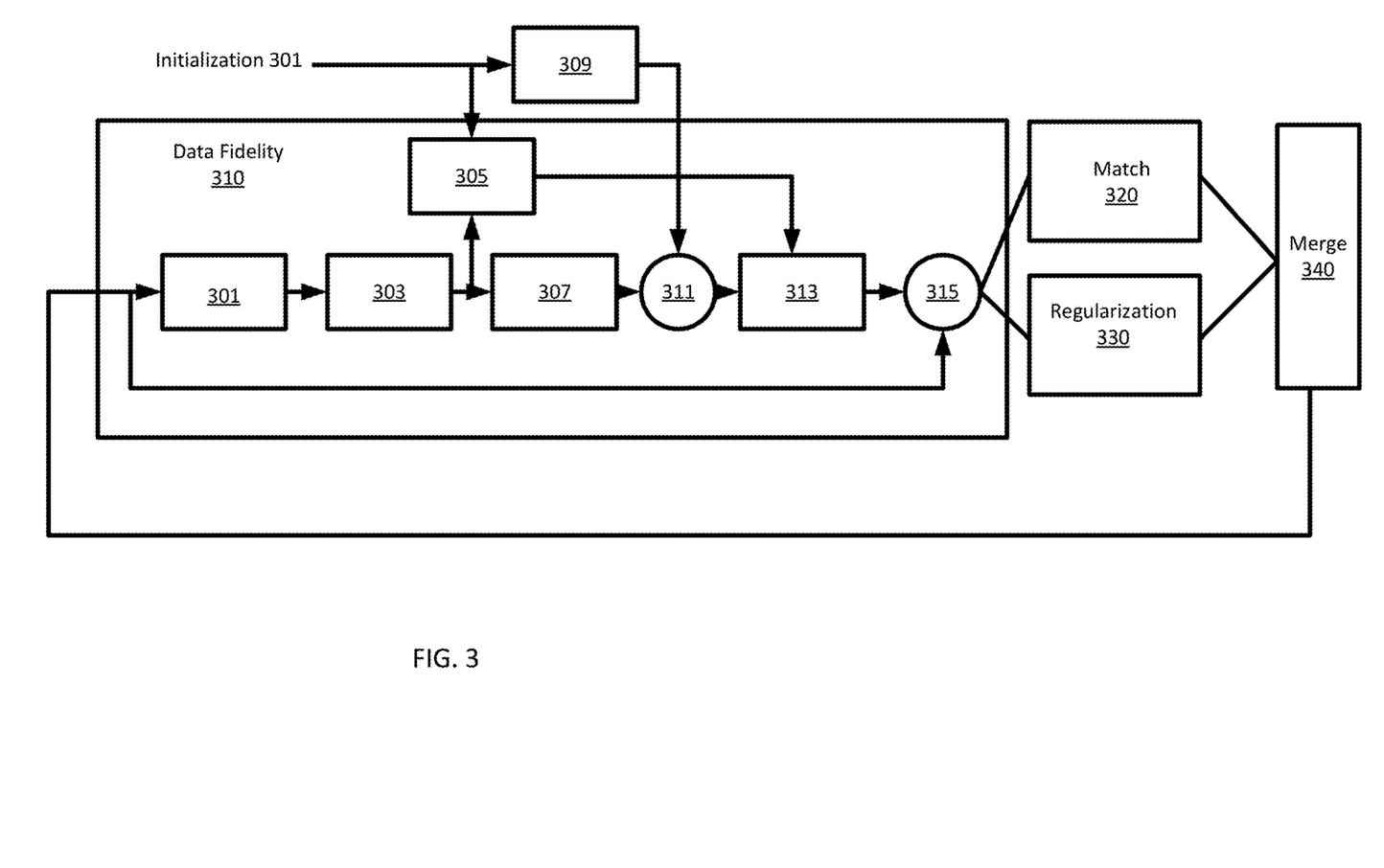
FIG. 3 depicts an iterative process for generating an image using magnetic resonance fingerprinting according to one embodiment.

FIG. 3 depicts a schematic diagram of an iterative method for reconstructing an image using MRF. The method includes the data fidelity stage 310, the signal matching stage 320, the regularization stage 330, and the merging stage 340. In the data fidelity stage 310, an MR k-space signal is prepared to provide data for a dictionary search that occurs in the signal matching stage 320 and spatial regularization that is performed in the regularization stage 330. The signal matching stage 320 and the regularization stage 330 are performed in parallel. The outputs of the signal matching stage 320 and regularization stage 330 are merged at the merging stage 340. Each iteration of the reconstruction provides a result from the merging stage 340 for input back to the data fidelity stage 310 for the next iteration. Through iteration, the MR k-space signal may be used to update or modify an image. After the last iteration, data represented the object is output.

In a first iteration of the reconstruction starting at initialization 301, one or more undersampled k-space signals are acquired from the MR data. The undersampled k-space signals are separated temporally. At box 309, the undersampled k-space signals are compressed and an inverse Fourier transform is performed on the compressed signals in order to obtain one or more images in a compressed space from the one or more undersampled k-space signals. The MR data may be compressed to a low rank using low rank approximation or other compression algorithm. Low rank approximation is a minimization problem, in which the cost function measures the fit between a given matrix (the MR data) and an approximating matrix (the optimization variable), subject to a constraint that the approximating matrix has reduced rank. The MR data may be compressed to a rank of between 5 and 20. The compression of the MR data imposes low rank upon the regularization stage and provides appropriately compressed data for the matching stage.

The one or more compressed images may be stored at a memory location and may be retrieved during subsequent iterations. Continuing through the data fidelity stage 310, the one or more images in the compressed space are provided to a difference generator 311 that determines a difference between the one or more compressed images and one or more compressed images from a previous iteration. In the first iteration, the "previous" one or more compressed images may be null images or images that are initialized to include non-zero values, such as a temporal average of image values. The one or more compressed images created at the difference generator 311 are scaled by a factor or "step size" a at scaling box 313. The scaled one or more images are then used to update the one or more images from the previous iteration at a summing device 315. The one or more updated images are then provided to the signal matching stage 320.

For second and subsequent iterations, the one or more compressed images output from the merging step during a previous iteration are provided as input to the data fidelity stage 310. At box 301, the merged one or more compressed images undergo a Fourier transform to obtain k-space data and the resulting k-space data is decompressed. The decompression mirrors the compression. A sampling mask is applied to the decompressed k-space data at box 303. The sampling mask creates an undersampled data set in k-space which is compared at box 303 to the measured undersampled k-space signals to determine a scalar difference between the signals. The scalar difference is used to determine the step size (a) that is determined at box 305. This scaling may be applied once at the second iteration or every time for the subsequent iterations. The undersampled data from box 303 is compressed at box 307 and a Fourier transform is performed to obtain one or more compressed images that are output to box 311. The compression is done at a low rank, for example, 5, 8, between 10 or 20, or less than the rank of the dictionary. At the difference generator 311, the one or more compressed images are subtracted from the one or more compressed images to generate an image gradient. In one embodiment, the one or more compressed images are images that were stored in a memory location or memory storage device during the first iteration. For the second and subsequent iterations, the initialization steps 301 and 309 may not be performed. For example, as the previous images are taken from the output of the previous iteration and are not, for example, null images. The image gradient is scaled by the determined step size a. The scaled image gradient and the one or more previous images are supplied to the summing device 315. The summing device 315 adds the scaled imaged gradient to the one or more previous images to obtain one or more updated images. The one or more updated images are then supplied from the summing device 315 to the signal matching stage 320 and the regularization stage 330.

The matching stage 320 receives the one or more updated compressed images from the data fidelity stage 310, determines a time evolution signal for each pixel or voxel of the one or more updated compressed images and performs a dictionary search to locate a fingerprint that is an acceptable match to the time evolution signal. One or more magnetic resonance parameters are associated with the selected fingerprint. By identifying the fingerprint, the matching stage 320 provides one or more magnetic resonance parameters that may be used to construct an image for merging at the merging stage 340.

As the images received at the matching stage 320 are compressed images, the time evolution signal obtained is a compressed time evolution signal that may not be temporally consistent. However, a temporally consistent time evolution signal may be constructed from the compressed time evolution signal. Once a fingerprint is selected, the magnetic resonance parameters associated with the fingerprints are retrieved from the compressed dictionary. The retrieved parameters may be used to generate one or more compressed images that represent T1, T2, and/or proton maps. The dictionary search of the matching stage 320 includes a step for comparing data and a searching algorithm that determines how to navigate through the compressed dictionary efficiently to locate an optimal or nearest neighbor fingerprint for the time evolution signal. The search step may be computationally expensive. Different techniques may be used to diminish the time or effort for searching. The fingerprint matching is based on a compressed dictionary. The dictionary may be compressed to impose low rank, for example, between ten or twenty and/or less than the rank of the dictionary.

In an embodiment, the search is performed using a k-d tree search of the compressed dictionary through to select a leaf node of the k-d tree and a search of a selected number of data points within a hypersphere of the selected leaf node to select the magnetic resonance fingerprint representative. Other nearest neighbor search techniques using other tree structure (cover tree, k-means tree), or locality sensitive hashing (LSH) may be used instead.

In one embodiment, the method reduces computation time for comparing data by compressing dictionary entry data to obtain a representation of the dictionary entry in a more compact space. Various compression methods may include singular value decomposition (SVD) or principal component analysis (PCA). In one embodiment, SVD is used on the dictionary fingerprints in order to reduce the computation time for matching experimentally acquired time evolution signals to fingerprints and for performing the various Fourier transforms of the data fidelity stage 310. The fingerprint dictionary may be compressed much beyond its rank, for example, to a number of components, for example between five and twenty, while the sequence length may be longer than three hundred. The compression imposes low rankness on the reconstructed image data.

In an embodiment, the dictionary is compressed to a low rank, for example, to a number of components related to the rank (e.g. between five and twenty) of the images data volume reshaped in a matrix form of size "number of pixels" times "number of time points." In this way, a low-rank prior is imposed without the need to perform nuclear norm minimization (SVD followed by singular values thresholding) at each iteration as it is the case for classical low-rank projection.

A matching or pattern recognition algorithm may be used to select a signal vector or a weighted set of signal vectors from the compressed dictionary that best correspond to the observed signal evolution. All the parameters that were used to build this signal vector in the dictionary may then be retrieved simultaneously. An estimated compressed image is generated using the one or more of the MR parameters retrieved from the database as a result of the search. The compressed image may also be multiplied by an associated fingerprint in order to modify the compressed images.

Auxiliary variables are also introduced as in a generalized forward backward (GFB) algorithm. The role of the auxiliary variables, as in GFB and similarly as in the method of partial inverses, is to map the optimization problem with multiple regularization functions (the fingerprint stage (e.g. Bloch regularization) and the spatial regularization) to the original problem (but in a larger product space) of the classical forward-backward algorithm where there is only one regularization function. The auxiliary variables have the same format and size as the compressed images. In GFB there may be any number of regularization functions that are assumed to be convex and lower semi continuous, while here only two regularization functions, one of them being convex (spatial regularization), the other one being Bloch manifold projection (a.k.a. fingerprint matching) which is not convex, and not lower semi continuous because it is discretized.

The one or more compressed images from the data fidelity stage 310 are also modified by a regularization stage 330. The regularization stage 330 may be used to reduce or correct for noise in the images. The output of the regularization stage 330 is a set of images in the same format as its input but regularized i.e. with less noise and spatial artifacts.

Low rank may be imposed upon the regularization stage 330 by compression performed during the data fidelity stage 310. Different methods such as Tikhonov regularization, Wavelet image restoration, sparsity based denoising and inversion, or Total Variation (TV) regularization may be used. Spatial regularization is applied on each slice of the image in the compressed domain for example, using a Chambolle dual algorithm for TV regularization. Other regularization such as L1 in the wavelet domain, joint sparse regularization or the cycle spinning technique may be applied. As the data is highly compressed (only 5 to 20 slice/component images) and the regularization is applied on each component image individually, and Chambolle dual algorithm converges very fast especially in the first iterations (only few iterations may be used (e.g. 5)), the spatial regularization may be executed efficiently. Cycle spinning and joint sparse regularization (using cycle spinning) are even faster technique. If the data is not compressed to impose low-rankness to the image, performing the spatial regularization 330 on each time slice would take larges amount of time and would be inefficient. Alternative algorithms may be used for TV regularization.

The generated compressed images from the regularization stage 330 and the matching stage 320 are merged together at the merging stage 340. Merging the images may be performed by averaging values for each corresponding pixel from the matching stage 320 and the regularization stage 330. The output of the merging stage 340 are provided as input to the data fidelity stage 310 for another iteration. The merged image(s) and values used in the stages may be stored at a memory location or memory storage device and used in subsequent iterations.

At act A130 of FIG. 1, the reconstructed object is output. This object contains the tissue maps (e.g. T1, T2 and PD maps, etc) and optionally the merged image 340 (i.e. the output of the merging stage). The tissue maps are obtained during the fingerprinting matching step 320 or as explained below, the tissue maps may be computed from the merged image 340 by an additional fingerprint matching step. After a number of iterations, for example, 5, 10, or 20, the reconstructed object may be output for display or use by an application. The number of iterations may be predefined or may be determined as a function of the output images. For example, the output images from the merging stage 340 may be compared to initial images to determine if a further iteration is useful or required. Image quality may be determined by using one or more image quality algorithms, for example, that identify noise or quality in the image.

In an embodiment, one further iteration of fingerprint matching is performed on the output to generate one or more images for output or display.

Figure 4:
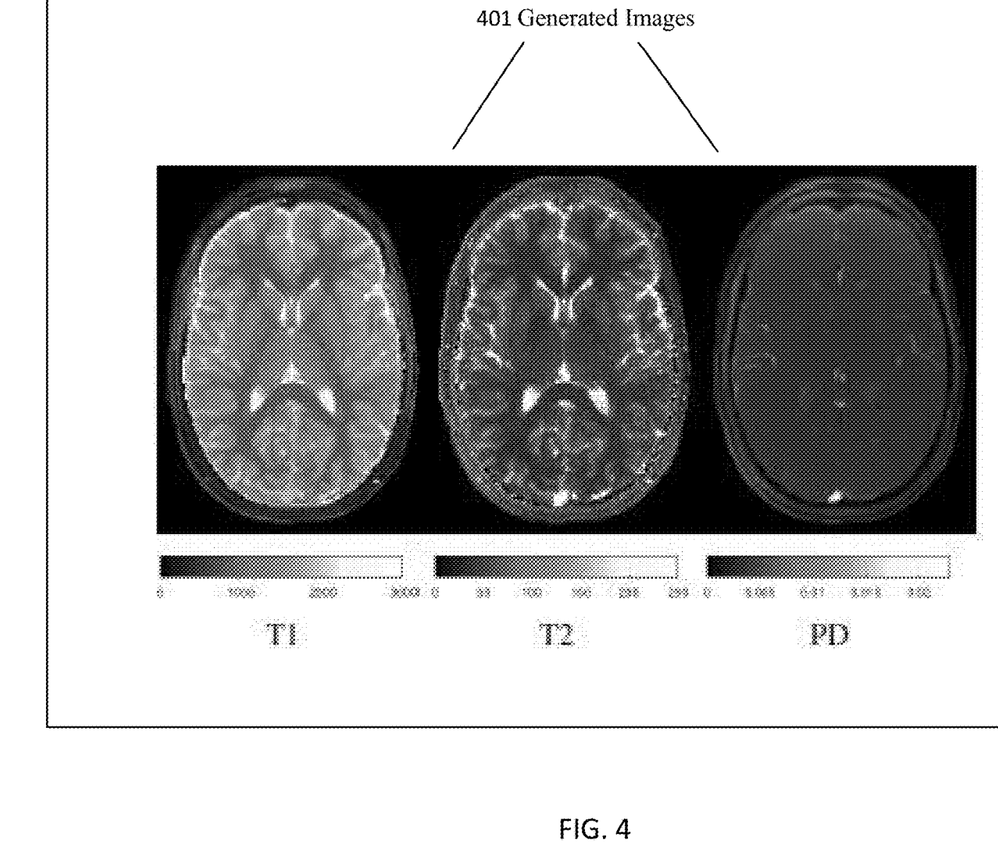
FIG. 4 depicts example output images of the method of FIG. 2.

FIG. 4 depicts example generated images 401 using the method of FIG. 2. Three images representing T1, T2, and PD are depicted in FIG. 4. The output images may be used by an operator to make a medical diagnosis. The output images may be further processed or analysis to generate a medical diagnosis. The images may be provided in 2D, 3D, 4D, color, B&W, etc. The image(s) 401 may include annotation or overlays to assist in a diagnosis by an operator. The images 401 may be stored for later use or viewing.

Figure 5:
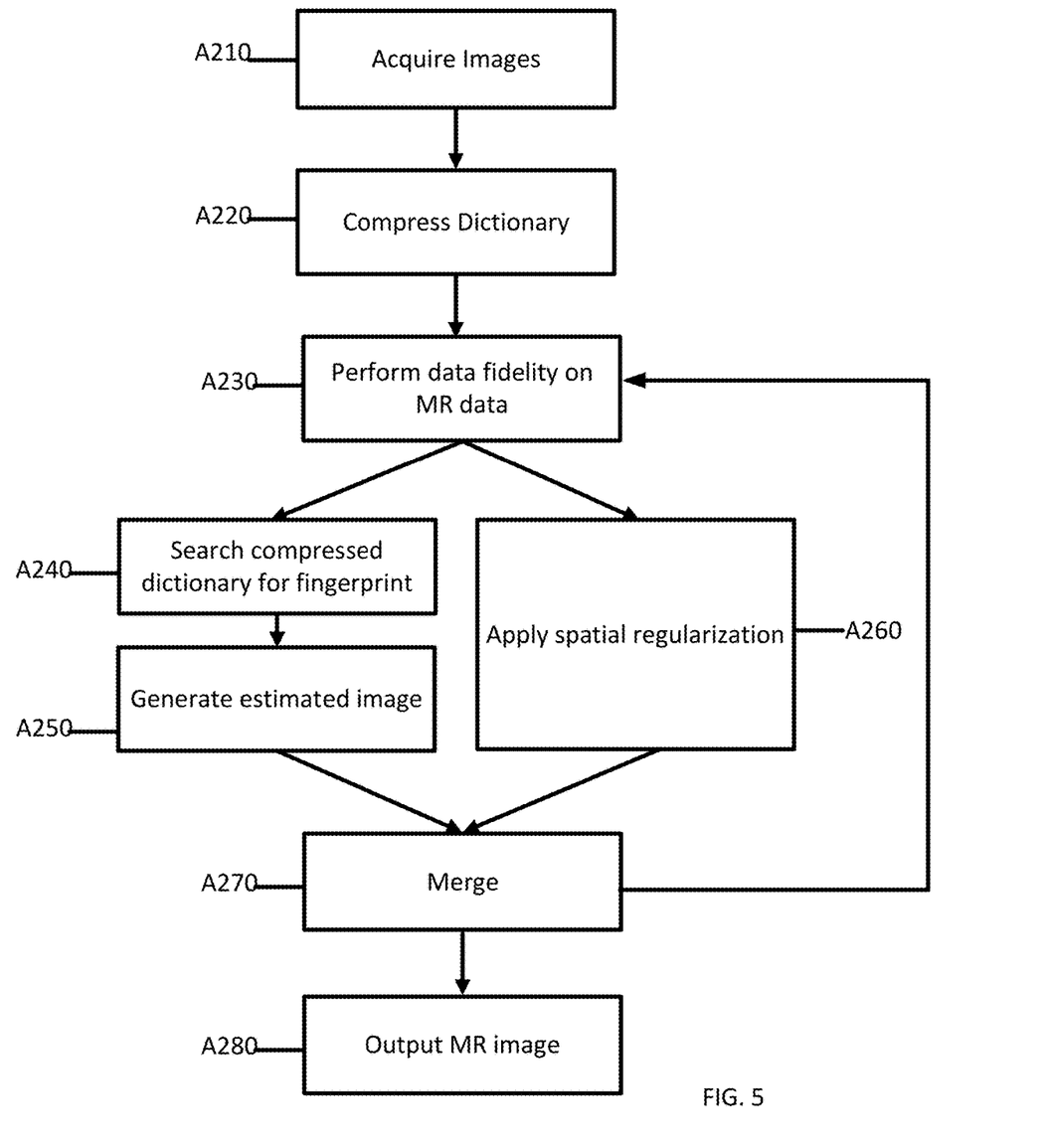
FIG. 5 depicts an example method for generating an image using magnetic resonance fingerprinting.

FIG. 5 depicts a further embodiment of a method for generating a magnetic resonance image 401 of an object. The acts are performed by the system of FIG. 1, FIG. 6, other systems, a workstation, a computer, and/or a server. The acts are performed in the order shown (e.g., top to bottom) or other orders. In the method of FIG. 5, the fingerprint matching and the spatial regularization are performed in parallel. The method is derived from a generalized forward-backward splitting algorithm that generalizes the forward-backward algorithm to deal with multiple non-smooth functions (e.g. the indicatrices of the Bloch manifold of the fingerprint matching, and the spatial regularization). As for the forward-backward algorithm, the regularity of the data fidelity term is explicitly used with a gradient step (forward step), and the proximity operators of the non-smooth terms are applied in parallel (backward step).

At act A210, one or more compressed images representing MR image data are acquired from one or more magnetic resonance k-space signals obtained from the object. As depicted and described in FIG. 1 above, the MR image data may be acquired using MR scanners. For example, gradient coils, a whole-body coil, and/or local coils generate a pulse or scan sequence in a magnetic field created by a main magnet or coil. The whole-body coil or local coils receive signals responsive to the re-orientation of molecules shifted due to the scan sequence. In an embodiment and used as an example below, the MR data may represent image data for a brain of a patient. Different objects, organs, or regions of a patient may also be scanned.

The compressed image may be k-space data or image data. Image data is MR data after Fourier transform into object space. The image data may be data at any point after transform, as such, the image data may be scalar values or may be formatted as RGB values for a display screen. The MR data may be scan data to be used to generate an image on a display. The MR data may represent volumes. Three-dimensional datasets are obtained or generated using slices of two-dimensional data. As k-space data, information content may be provided that is responsive to a three-dimensional distribution of locations. However, the data itself may not directly represent the locations prior to transform. In alternative embodiments, two-dimensional datasets representing or responsive to tissue in planes are obtained.

To generate a compressed image, acquired MR data may be compressed to a low rank using low rank approximation. Low rank approximation is a minimization problem in which the cost function measures the fit between a given matrix (the MR data) and an approximating matrix (the optimization variable), subject to a constraint that the approximating matrix has reduced rank. The MR data may be compressed to a low rank of, for example, between 10 and 20. The compression of the MR data results in the imposition of low rank upon the regularization stage 330. The compression of the MR data also provides appropriately compressed data for the matching stage 320.

Alternative methods may be used to acquire the compressed image. The compressed image may be acquired remotely from the server or workstation or may be acquired at a different time, for example, hours or days prior to the processing provided below in Acts A220-A270. The compressed image may be stored locally onsite or offsite, for example in the cloud.

At act A220, a magnetic resonance fingerprint dictionary is compressed to a value. In an example, the fingerprint dictionary is compressed to a value of its rank. The fingerprint dictionary may be compressed to using the same compression as used to generate the compressed image.

At act A230, data fidelity is performed on the MR image data. The compressed images are provided to a difference generator that determines a difference between the one or more compressed images and one or more compressed images from a previous iteration. For a first iteration where there are no previous generated compressed images, the "previous" one or more compressed images may be null images or images that are initialized to include non-zero values, such as a temporal average of image values. The one or more compressed images created at the difference generator are scaled by a factor or "step size" a at scaling box. The scaled one or more images are then used to update the one or more images from the previous iteration at a summing device. The one or more updated images are then provided to the signal matching stage 320 and to the regularization stage 330.

For subsequent iterations, the one or more compressed images output from the merging process during a previous iteration are provided as input to the data fidelity stage 310. The previous one or more compressed images undergo a Fourier transform to obtain k-space data and the resulting k-space data is decompressed. The decompression mirrors the compression step. A sampling mask is applied to the decompressed k-space data. The sampling mask creates an undersampled data set in k-space which is compared to the measured undersampled k-space signals to determine a scalar difference between the signals. The scalar difference is used to determine the step size (a) for box. This scaling may be applied once at the second iteration or every time for the subsequent iterations. The undersampled data from box is compressed and a Fourier transform is performed to obtain one or more compressed images. The compression is done at a low rank, for example, between 10 or 20 or less than the rank of the dictionary. At the difference generator, the one or more compressed images are subtracted from the one or more compressed images to generate an image gradient. In one embodiment, the one or more compressed images are images that were stored in a memory location or memory storage device during the first iteration. For the second and subsequent iterations, the initialization steps may not be performed. For example, as the previous images are taken from the output of the previous iteration and are not, for example, null images. The image gradient is scaled by the determined step size a. The scaled image gradient and the one or more previous images are supplied to the summing device. The summing device adds the scaled imaged gradient to the one or more previous images to obtain one or more updated images. The one or more updated images are then supplied from the summing device to the signal matching stage 320 and the regularization stage 330.

At act A240, the compressed dictionary is searched for a representative magnetic resonance fingerprint. The signal matching stage 320 receives the one or more updated images from the data fidelity stage 310, determines a time evolution signal for each pixel or voxel in the one or more images and performs a dictionary search to locate a fingerprint that is an acceptable match to the time evolution signal. One or more magnetic resonance parameters are associated with the selected fingerprint. By identifying the fingerprint, the signal matching stage 320 provides one or more magnetic resonance parameters that may be used to construct an image. Parameter maps are formed through a pattern matching algorithm that matches the alias-distorted magnetization response sequences per voxel or pixel to the response predicted from Bloch equations.

The fingerprint matching finds the most correlated fingerprint ˆki in the dictionary for each voxel or pixel i using the following equation:

$$\hat{k}_i = \operatorname*{argmax}_{k} \frac{|\langle D_{c(k,:)}, \hat{X}_{c(i,:)} \rangle|}{\|D_{c(k,:)}\|_2}.$$

The proton density can then be estimated using the following equation:

$$\hat{\rho}_i = \max\left\{ \frac{\operatorname{real}\langle D_{c(\hat{k}_i,:)}, \hat{X}_{c(i,:)} \rangle}{\|D_{c(\hat{k}_i,:)}\|_2^2}, 0 \right\},$$

where $D_c$ is the discretized dictionary after compression ($D_c=DV_d$) and $D_c(k,:)$ is the k-th fingerprint of the discretized dictionary. The fingerprint matching may be performed directly in the compressed domain since the dictionary decompression (adjoint of the compression operator) is an isometry.

At act A250, an updated compressed image is generated using the representative magnetic resonance fingerprint. Once a fingerprint has been selected, the values of the magnetic resonance parameters associated with the fingerprints may be retrieved from the compressed dictionary. The retrieved parameters may be used to generate one or more images. The dictionary search of the signal matching stage 320 includes a step for comparing data and a searching algorithm that determines how to navigate through the compressed dictionary efficiently to locate an optimal or nearest neighbor fingerprint for the time evolution signal. Once the fingerprint is identified, the quantitative tissue values θ={T1i, T2i, ... } are obtained by a simple lookup table, while the proton density is obtained by the equation described above.

At act A260, spatial regularization is applied to the one or more updated images from the data fidelity stage 310. Spatial regularization may use a Chambolle dual algorithm for TV regularization. Other regularization such as L1 in the wavelet domain or the cycle spinning technique or joint sparse regularization may be applied. The data is highly compressed (only 5 to 20 slice/component images) and the regularization is applied on each component image individually, and Chambolle dual algorithm converges very fast especially in the first iterations (only few iterations may be used (e.g. 5)) and as such, the spatial regularization may be executed efficiently. Cycle spinning or joint spare regularization may be even faster. If the data is not compressed to impose low-rankness on the image, performing the spatial regularization on each time slice would take larges amount of time and would be inefficient. Alternative algorithms may be used for TV regularization.

At act A270, the output of the matching stage 320 and the spatial regularization stage 330 are merged to generate one or more images. The performance of the matching stage 320, e.g. A240, A250 and the spatial regularization stage 330, e.g. A260, may be done in parallel, for example concurrently. The merging may be performed by averaging associated values for pixels or voxels from the outputs. In an embodiment, the output of matching stage 320 and the output of the spatial regularization stage 330 may be weighed differently for merging.

At act A280, the method outputs the one or more images. Acts A230-A270 may be repeated for a plurality of iterations to further adjust the image. The number of iterations may range from as few as two to as many as 5, 10, 20, or 100. The number of iterations may be predetermined. In an embodiment, an additional matching stage 320 may be performed prior to outputting the one or more images. The additional matching stage 320 may take the final merged output and generate one or more images for display or analysis. The one or more images may include T1, T2, PD, or other weighted images. For T1-weighted the maximum T1 contrast is shown. For T2-weighted, the maximum T2 contrast is shown. For proton density (PD) weighting, the density of hydrogen protons is shown.

Figure 6:
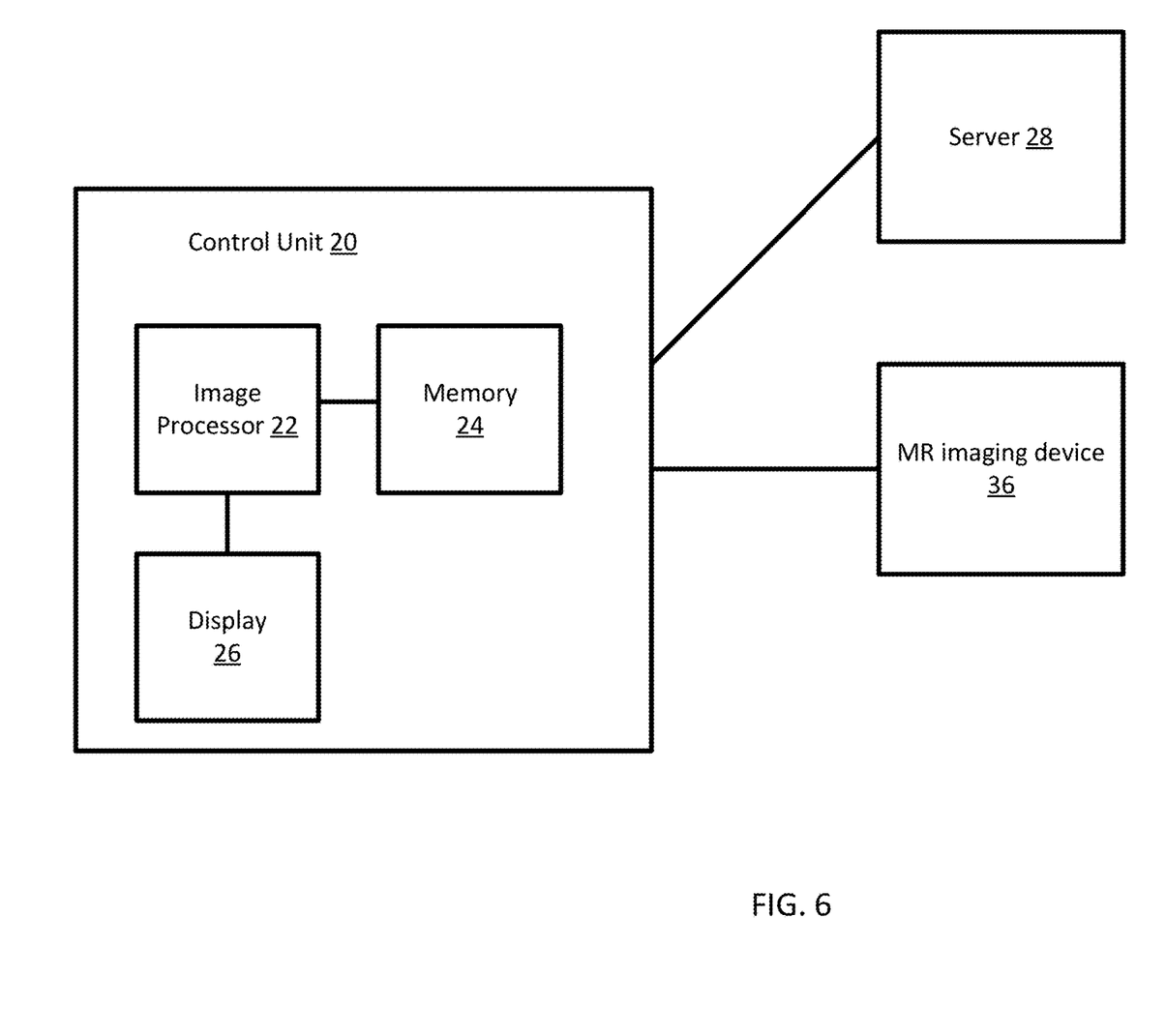
FIG. 6 depicts an example system for generating an image using magnetic resonance fingerprinting.

FIG. 6 depicts one embodiment of a control unit for generating an image from MR data using magnetic resonance fingerprinting. The control unit includes an image processor 22, a memory 24, and a display 26. The control unit 20 may be connected with a server 28 and an MR imaging device 36. Additional, different, or fewer components may be provided. For example, network connections or interfaces may be provided, such as for networking between the control unit 20 and server 28. A workstation with a user interface may be provided for an operator to input data.

The MR imaging device 36 may be similar to the MR imaging device as depicted in FIG. 1. The MR imaging device 36 is configured to acquire MR data that may be processed into one or more images by the control unit 20.

The control unit 20 may provide commands to the MR imaging device 36. Alternatively, the MR imaging device 36 may function entirely on its own without any input from the control unit 20.

The image processor 22 (or processor) is a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for processing an image. The processor 22 is a single device or multiple devices operating in serial, parallel, or separately. The processor 22 may be a main processor of a computer, such as a laptop or desktop computer, or may be a processor for handling some tasks in a larger system, such as in the MRI system. The processor 22 is configured by instructions, design, hardware, and/or software to perform the acts discussed herein.

The server 28 may be co-located with the control unit 20 or may be located remotely. The server 28 may connect to the MRI system 100 or control unit 20 via a network. The network is a local area, wide area, enterprise, another network, or combinations thereof. In one embodiment, the network is, at least in part, the Internet. Using TCP/IP communications, the network provides for communication between the processor 24 and the server 28. Any format for communications may be used. In other embodiments, dedicated or direct communication is used.

The server 28 may include the processor 24 or group of processors. More than one server 28 or control unit 20 may be provided. The server 28 is configured by hardware and/or software. The server 28 may acquire and the memory 24 may store MR data from multiple different MRI systems. The processor 24 and/or server 28 are configured to perform the acts discussed above for generating an image using magnetic resonance fingerprinting. The processor 24 and/or server 28 may access and implement the code stored in memory 24.

The memory 24 may be a graphics processing memory, a video random access memory, a random-access memory, system memory, cache memory, hard drive, optical media, magnetic media, flash drive, buffer, database, combinations thereof, or other now known or later developed memory device for storing data or video information. The memory 24 is part of the control unit 20, part of a database, part of another system, a picture archival memory, or a standalone device. The memory 24 may store data from the MRI system. The memory 24 may store an instruction set or computer code configured to implement the low rank and spatial regularization model for MRF.

In an embodiment, the memory 24 stores an instruction set or computer code for an iterative gradient proximal algorithm for MRF where the estimated image series X is estimated according to the following four steps: 1) gradient step to improve data consistency, 2) fingerprint matching, 3) spatial regularization via total variation (TV) regularization, and 4) merging. Fingerprint SVD compression along the time dimension is used to accelerate both the matching and the spatial regularization that operates in the compressed domain as well as to enforce low-rank regularization. The dictionary is compressed to a small rank value. The iterative algorithm may be formalized as the following process:

Input: Y, λ.
Initialize:

-continued $k := 0, \hat{X}_c^{(0)} := 0, Z_{block}^{(0)} := 0, Z_{splat}^{(0)} : 0.$
while $k < K_{max}$ do
  | Gradient update:
  | $G := \hat{X}_c^{(k)} - \alpha_k g^H(g(\hat{X}_c^{(k)}) - Y$
  | Fingerprint matching:
  | $Z_{block}^{(k+1)} := P_{D_c}(G + O_{block}) - O_{block}$
  | with $O_{block} = \hat{X}_c^{(k)} - Z_{block}^{(k)}$
  | Spatial regularization:
  | $Z_{splat}^{(k+1)} := prox_{\alpha_k \lambda R}(G + O_{splat}) - O_{splat}$
  | with $O_{splat} = \hat{X}_c^{(k)} - Z_{splat}^{(k)}$
  | Merging:
  | $\hat{X}_c^{(k+1))} := (Z_{block}^{(k+1)} + Z_{splat}^{(k+1)})/2$
  | $k := k = 1$
end
Fingerprint matching:
$[\hat{X}_c^{(k+1)}, \hat{\theta}, \hat{\rho}] := P_{D_c}(\hat{X}_c^{(k)})$
return $\hat{X}_c^{(k+1)}, \hat{\theta}, \hat{\rho}$ where $\hat{X}_c$ is the estimated compressed image series, $\hat{\theta}$ are the estimated T1 and T2 maps, and $\hat{\rho}$ is the estimated proton density map. The algorithm is derived from a generalized forward backward splitting algorithm that generalizes the forward-backward algorithm to deal with multiple non-smooth functions (the indicatrices of the Bloch manifold, and the spatial/TV regularization). Similar to the forward-backward algorithm, the regularity of the data fidelity term is explicitly used with a gradient step (forward step), and the proximity operators of the non-smooth terms are applied in parallel (backward step).

For α in the gradient update, the selection of the step size is important to ensure convergence and good reconstruction performance. The forward backward algorithm is known to converge for $\alpha < 2/L(\nabla f)$, where $L(\nabla f)$ denotes the Lipschitz constant of the gradient off. In an embodiment, $f = \frac{1}{2}G(X^{\hat{}}c) - Y2/2$ and thus $L(\nabla f)$ is the spectral radius of GHG that is equal to one if the (non-uniform) Fourier and sampling operations were properly normalized and compensated. In practice, accurate knowledge of $L(\nabla f)$ may not be obtainable. The calculation of f provides convergence for all the cases including the worst case scenario. For a backtracking strategy convergence may be guaranteed via a backtracking line search. Such a method first checks a condition at the end of each iteration. A backtracking condition enforces that the objective has decreased "sufficiently". If this condition fails, the step size is decreased, and the current iteration is restarted until the backtracking condition holds.

For spatial regularization, Chambolle dual algorithm for total variation (TV) regularization, L1 thresholding in the wavelet domain, Chambolle-Pock algorithm for L1 minimization on a redundant sparse representation, joint sparse regularization, or a cycle spinning technique may be used.

The memory may store an instruction set for obtaining a magnetic resonance image 401 of an object, the method including: acquiring one or more compressed images from one or more magnetic resonance k-space signals obtained from the object and iteratively reconstructing an image. Each iteration includes updating a gradient, applying fingerprint matching to the one or more compressed images to generate one or more first updated compressed images, applying spatial regularization to the one or more compressed images to generate one or more second updated compressed images, and merging the one or more first updated compressed images and the one or more second updated compressed images. The one or more merged compressed images are used as input for a subsequent iteration. Applying fingerprint matching and applying spatial regularization are performed concurrently. In an embodiment, auxiliary variables are also introduced as in a GFB algorithm. The role of the auxiliary variables, as in GFB and similarly as in the method of partial inverses is to map an optimization problem with multiple regularization functions (two in our case: the Bloch regularization via fingerprint matching and the spatial regularization) to the original problem (but in a larger product space) of the classical forward-backward algorithm where there is only one regularization function. The auxiliary variables have the same format and size as the compressed images.

The memory 24 or other memory is alternatively or additionally a non-transitory computer readable storage medium storing data representing instructions executable by the programmed processor 22. The instructions for implementing the processes, methods and/or techniques discussed herein are provided on non-transitory computer-readable storage media or memories, such as a cache, buffer, RAM, removable media, hard drive, or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code, and the like, operating alone, or in combination. Likewise, processing strategies may include multiprocessing, multitasking, parallel processing, and the like.

The display 26 may be configured to display images to an operator. The display 26 may augment the images with additional information or overlays. The display 26 may be configured to display the images in two dimensions, three dimensions, or, for example, in augmented or virtual reality scenarios.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A method for generating a reconstructed image of an object, the method comprising:
   acquiring one or more compressed images from one or more magnetic resonance k-space signals obtained from the object;
   iteratively reconstructing an image, wherein each iteration comprises:
      updating the one or more compressed images with a gradient;
      applying fingerprint matching to the one or more updated compressed images to generate one or more first compressed images;
      applying spatial regularization to the one or more updated compressed images to generate one or more second compressed images; and
      merging the one or more first compressed images and the one or more second compressed images; wherein the one or more merged compressed images are used as input for a subsequent iteration;
   displaying the reconstructed image.

2. The method of claim 1, wherein applying fingerprint matching and applying spatial regularization are performed concurrently.

3. The method of claim 1, wherein applying fingerprint matching comprises:
   compressing a dictionary to a value of a rank of the dictionary; and
   searching the compressed dictionary for a representative magnetic resonance fingerprint.

4. The method of claim 3, wherein the value of the rank is between 5 and 20.

5. The method of claim 3, wherein the value of the rank is 10.

6. The method of claim 3, wherein the value of the rank is that of a contrast images data volume reshaped in a matrix form of size comprising a number of pixels multiplied by a number of time points.

7. The method of claim 1, wherein applying spatial regularization comprises applying spatial regularization using one of: Chambolle dual algorithm for total variation regularization, L1 thresholding in the wavelet domain, Chambolle-Pock algorithm for L1 minimization on a redundant sparse representation, joint sparse regularization, or a cycle spinning technique.

8. The method of claim 1, wherein fingerprint matching is applied by exhaustive search, by a nearest neighbor search, or by a neural network.

9. The method of claim 1, wherein iteratively reconstructing comprises at least three iterations.

10. The method of claim 1, further comprising:
    applying, after a final iteration, fingerprint matching to the merged compressed image to generate the reconstructed image.

11. A method for generating a magnetic resonance image of an object, the method comprising:
    acquiring MR image data from one or more magnetic resonance k-space signals obtained from the object;
    compressing a dictionary to a value;
    performing data fidelity on the MR image data;
    searching the compressed dictionary for a representative magnetic resonance fingerprint;
    generating a first compressed image using the representative magnetic resonance fingerprint;
    applying spatial regularization to the first compressed image to generate a second compressed image;
    merging the first compressed image and the second compressed image; and
    repeating for at least two iterations, performing, searching, generating, applying, and merging.

12. The method of claim 11, further comprising:
    applying, after a final iteration, fingerprint matching to the merged compressed image to generate the image.

13. The method of claim 11, wherein the spatial regularization is applied using one of Chambolle dual algorithm for total variation regularization, L1 thresholding in the wavelet domain, Chambolle-Pock algorithm for L1 minimization on a redundant sparse representation, joint sparse regularization, or a cycle spinning technique.

14. The method of claim 11, wherein searching is done by exhaustive search, by a nearest neighbor search, or by a neural network.

15. The method of claim 11, comprising at least three iterations.

16. The method of claim 11, further comprising:
displaying the merged compressed image.

17. A system for generating an image using magnetic resonance fingerprinting, the system comprising:
- a magnetic resonance imaging device configured to acquire MR data;
- a control unit comprising:
  - a memory configured to store a compressed dictionary of magnetic resonance fingerprints; and
  - an image processor configured to iteratively construct the image from the MR data in parallel using the compressed dictionary of magnetic resonance fingerprints and spatial regularization, wherein each iteration comprises:
- applying data fidelity to the MR data;
- performing fingerprint matching of the MR data using the compressed dictionary;
- generating an estimated image using parameters of a matched fingerprint;
- applying spatial regularization to the MR data; and
- merging an output of the spatial regularization and the estimated image.

18. The system of claim 17, further comprising:
a display configured to display the image.

19. The system of claim 17, wherein the spatial regularization is applied using one of Chambolle dual algorithm for total variation regularization, L1 thresholding in the wavelet domain, Chambolle-Pock algorithm for L1 minimization on a redundant sparse representation, joint sparse regularization, or a cycle spinning technique.

* * * * *